(12) United States Patent
Wang

(10) Patent No.: US 8,319,110 B2
(45) Date of Patent: Nov. 27, 2012

(54) DUAL-LAYER FLEXIBLE PRINTED CIRCUIT

(75) Inventor: Pei-Liang Wang, Tu-Cheng (TW)

(73) Assignee: Chi Mei Communication Systems, Inc., Tu-Cheng, New Taipei (TW)

( * ) Notice: Subject to any disclaimer, the term of this patent is extended or adjusted under 35 U.S.C. 154(b) by 316 days.

(21) Appl. No.: 12/813,609

(22) Filed: Jun. 11, 2010

(65) Prior Publication Data

US 2011/0114370 A1    May 19, 2011

(30) Foreign Application Priority Data

Nov. 18, 2009   (TW) .............................. 98139072 A

(51) Int. Cl.
    *H05K 1/00*      (2006.01)
(52) U.S. Cl. ...................................................... 174/254
(58) Field of Classification Search .................. 174/254; 361/749–751
    See application file for complete search history.

(56) References Cited

U.S. PATENT DOCUMENTS

| 6,252,176 | B1 * | 6/2001 | Kuramochi et al. | ........... 174/255 |
| 7,246,431 | B2 * | 7/2007 | Bang et al. | ...................... 29/835 |

* cited by examiner

*Primary Examiner* — Jeremy Norris
(74) *Attorney, Agent, or Firm* — Altis Law Group, Inc.

(57) ABSTRACT

A dual-layer flexible printed circuit is disclosed. The dual-layer flexible printed circuit includes an inner flexible printed circuit and an outer flexible printed circuit which overlaps the inner flexible printed circuit. The inner flexible printed circuit can be bent and forms a protrusion offset from the outer flexible printed circuit. The dual-layer flexible printed circuit further includes a fixing element to secure the protrusion to prevent the protrusion from extruding along a longitudinal direction of the dual-layer flexible printed circuit.

16 Claims, 3 Drawing Sheets

DUAL-LAYER FLEXIBLE PRINTED CIRCUIT

BACKGROUND

1. Technical Field

Embodiments of the present disclosure relates generally to flexible printed circuits, and particularly to a dual-layer flexible printed circuit.

2. Description of Related Art

Flexible printed circuits are widely applied to electronic devices such as computers, mobile phones, notebooks, and the like, for transmitting and receiving electric signals and data among electronic components. Generally, the existing flexible printed circuits are often designed with single layer structures, which can not always meet the high transmitting speed requirements of the multi-functional electronic devices.

Therefore, there is room for improvement within the art.

BRIEF DESCRIPTION OF THE DRAWINGS

Many aspects of the exemplary dual-layer flexible printed circuit can be better understood with reference to the following drawings. The components in the various drawings are not necessarily drawn to scale, the emphasis instead being placed upon clearly illustrating the principles of the dual-layer flexible printed circuit. Moreover, in the drawings, like reference numerals designate corresponding parts throughout the diagrams.

DETAILED DESCRIPTION

Figure 1:
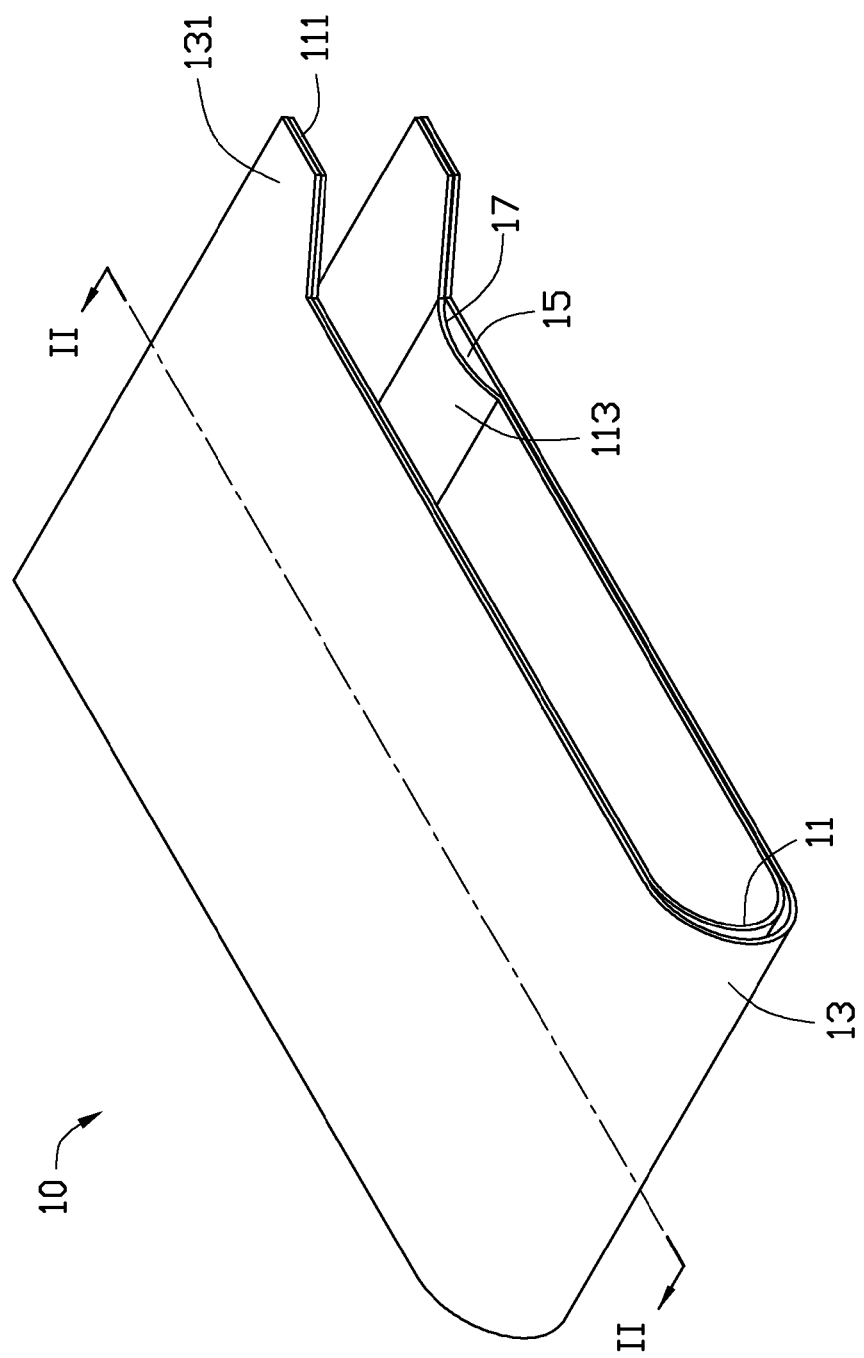
FIG. 1 shows a perspective view of a dual-layer flexible printed circuit, in accordance with an exemplary embodiment.

FIG. 1 shows a dual-layer flexible printed circuit 10 including an inner flexible printed circuit 11, an outer flexible printed circuit 13 and a fixing element 15. In this exemplary embodiment, the inner flexible printed circuit 11 is generally a band shaped flexible printed circuit with the same shape and length as the outer flexible printed circuit 13 and can be bent to be substantially U-shaped. The inner flexible printed circuit 11 includes a laminating area 111 disposed adjacent each distal end thereof.

The outer flexible printed circuit 13 can also be bent to be substantially U-shaped and has substantially the same shape and size as the inner flexible printed circuit 11. The outer flexible printed circuit 13 overlaps and covers the outside of the inner flexible printed circuit 11. The outer flexible printed circuit 13 includes a laminating area 131 disposed adjacent to the each distal end thereof corresponding to the laminating areas 111 of the inner flexible printed circuit 11. The laminating areas 131 of the outer flexible printed circuit 13 are fixed to the corresponding two laminating areas 111 of the inner flexible printed circuit 11 by surface mount technology (SMT). As the outer flexible printed circuit 13 and the inner flexible printed circuit 11 are both bent to be substantially U-shaped, a protrusion 113 is formed adjacent to one laminating area 111 of the inner flexible printed circuit 11 facing the other laminating area 111 of the inner flexible printed circuit 11. Protrusion 113 forms because of the same size and shape between the inner flexible printed circuit 11 and the outer flexible printed circuit 13 and their change in effective length after bending, resulting from them being attached to each other at their respective ends. The protrusion 113 may be formed by bending the inner flexible printed circuit 11 adjacent to one laminating area 111 toward the other laminating area 111 to form a substantially arcuate cross section. The protrusion 113 of the inner flexible printed circuit 11 is spaced from the outer flexible printed circuit 13 and forms an accommodating cavity 17 together with the outer flexible printed circuit 13.

Figure 2:
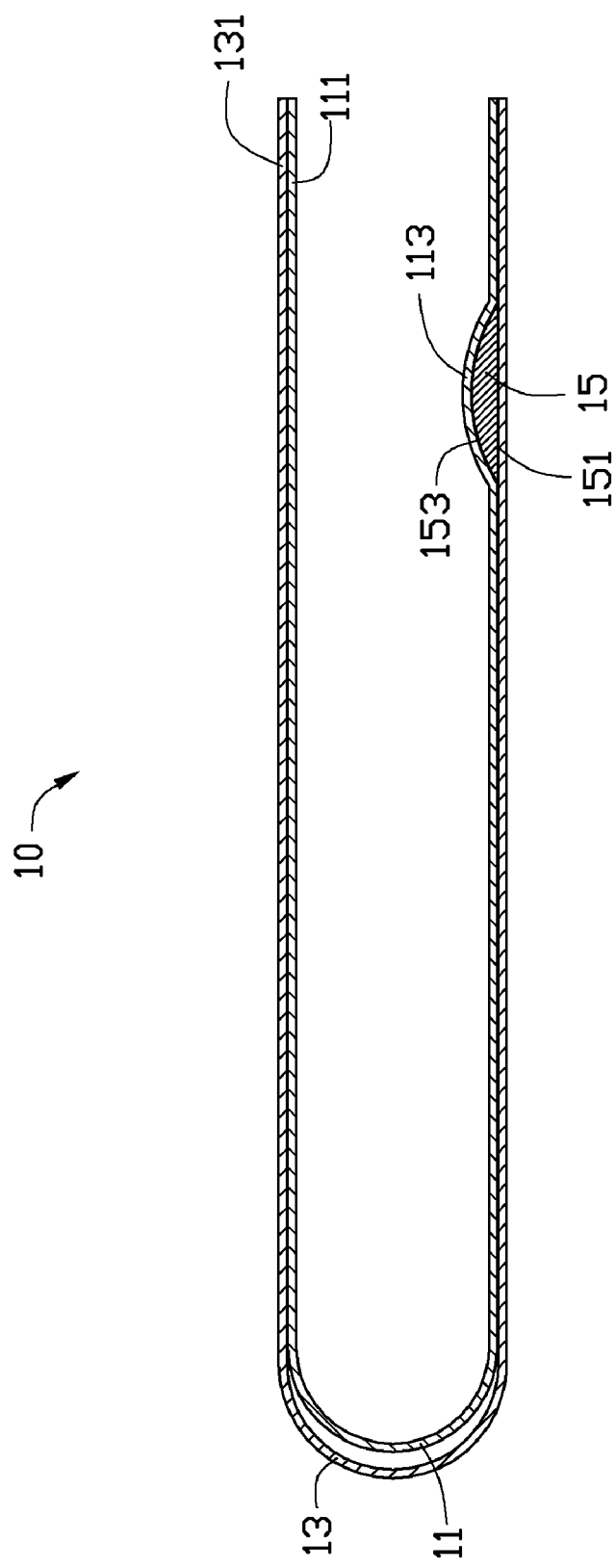
FIG. 2 shows a cross sectional view of the dual-layer flexible printed circuit taken along line II-II shown in FIG. 1, in accordance with an exemplary embodiment.

Also referring to FIG. 2, the fixing element 15 can be, for example, a rubber cushion with substantially the same shape and size as the accommodating cavity 17. The fixing element 15 is accommodated within the accommodating cavity 17, and positioned between the outer flexible printed circuit 13 and the inner flexible printed circuit 11, for fixing the protrusion 113 in place to prevent the protrusion 113 from extruding along the longitudinal direction of the dual-layer flexible printed circuit 10. The fixing element 15 includes a flat surface 151 and an arcuate surface 153. The flat surface 151 is adhered to the outer flexible printed circuit 13, and the arcuate surface 153 is adhered to the inner surface of the protrusion 113 of the inner flexible printed circuit 13.

Figure 3:
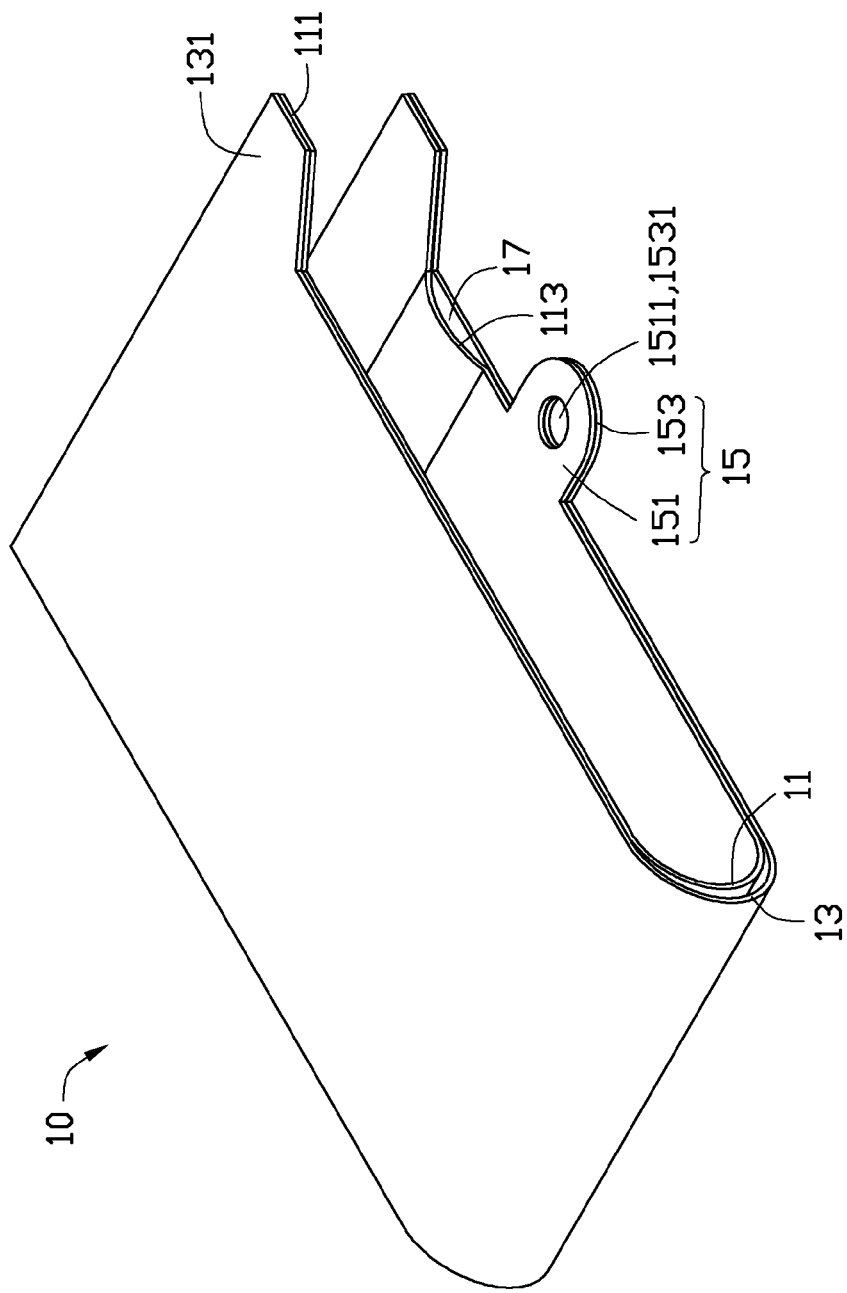
FIG. 3 shows another perspective view of the dual-layer flexible printed circuit, in accordance with a second exemplary embodiment.

FIG. 3 shows an alternative embodiment of a dual-layer flexible printed circuit 10. The fixing element 15 includes two first projecting lugs 151 and two second projecting lugs 153. The two first projecting lugs 151 protrude outwardly from the two sides of the inner flexible printed circuit 11 adjacent to the protrusion 113. Each first projecting lug 151 defines a first fixing hole 1511 therethrough. The two second projecting lugs 153 protrude outwardly from opposite sides of the outer flexible printed circuit 13 adjacent to the two first projecting lugs 151 respectively. Each second projecting lug 153 defines a second fixing hole 1531 therethrough corresponding to the first fixing hole 1511. The two first projecting lugs 151 are aligned with the two second projecting lugs 151 with the two first fixing holes 1511 aligning with the two second fixing holes 1531 respectively to position the protrusion 113 to prevent the protrusion 113 from extruding along the longitudinal direction of the dual-layer flexible printed circuit 10.

It is to be understood that even though numerous characteristics and advantages of the exemplary embodiments have been set forth in the foregoing description, together with details of structures and functions of various embodiments, the disclosure is illustrative only, and changes may be made in detail, especially in matters of shape, size, and arrangement of parts within the principles of the exemplary invention to the full extent indicated by the broad general meaning of the terms in which the appended claims are expressed.

What is claimed is:

1. A dual-layer flexible printed circuit, comprising:
   an inner flexible printed circuit comprising two laminating areas respectively positioned at two distal ends thereof and a protrusion formed adjacent to one distal end thereof;
   an outer flexible printed circuit comprising two laminating areas respectively positioned at two distal ends thereof corresponding to the laminating areas of the inner flexible printed circuit, the outer flexible printed circuit overlapping the inner flexible printed circuit with the laminating areas of the outer flexible printed circuit fixed to the corresponding laminating areas of the inner flexible printed circuit such that the protrusion of the inner flexible printed circuit is spaced from the outer flexible printed circuit and forms an accommodating cavity with the outer flexible printed circuit; the laminating areas of the inner flexible printed circuit and the outer flexible at two sides of the protrusion fixed together; and a fixing element accommodated within the accommodating cavity, and positioned between the outer flexible printed circuit and the inner flexible printed circuit, for preventing the protrusion from extruding along the longitudinal direction of the dual-layer flexible printed circuit.

2. The dual-layer flexible printed circuit as claimed in claim 1, wherein the fixing element is a rubber cushion with substantially the same shape and size as the accommodating cavity.

3. The dual-layer flexible printed circuit as claimed in claim 1, wherein a portion of the cross section of the protrusion is substantially arcuate and formed by bending the inner flexible printed circuit adjacent to one distal end thereof toward the other opposite end of thereof.

4. The dual-layer flexible printed circuit as claimed in claim 3, wherein the fixing element includes a flat surface and an arcuate surface, the flat surface is adhered to the outer flexible printed circuit, and the arcuate surface is adhered to the inner surface of the protrusion of the inner flexible printed circuit.

5. The dual-layer flexible printed circuit as claimed in claim 1, wherein the inner flexible printed circuit is a band shaped flexible printed circuit and bent to be substantially U-shaped.

6. The dual-layer flexible printed circuit as claimed in claim 5, wherein the protrusion is formed adjacent to one laminating area of the inner flexible printed circuit facing the other laminating area of the inner flexible printed circuit.

7. The dual-layer flexible printed circuit as claimed in claim 6, wherein the outer flexible printed circuit is substantially U-shaped and has substantially the same shape and size as the inner flexible printed circuit.

8. The dual-layer flexible printed circuit as claimed in claim 7, wherein the two laminating areas of the outer flexible printed circuit are fixed to the corresponding two laminating areas of the inner flexible printed circuit by surface mount technology.

9. The dual-layer flexible printed circuit as claimed in claim 1, wherein the fixing element further comprises two first projecting lugs and two second projecting lugs; the two first projecting lugs protruding outwardly from the opposite sides of the inner flexible printed circuit adjacent to the protrusion; the two second projecting lugs protruding outwardly from the opposite sides of the outer flexible printed circuit adjacent to one end thereof.

10. A dual-layer flexible printed circuit, comprising:
an inner flexible printed circuit comprising a protrusion formed adjacent to one distal end thereof;
an outer flexible printed circuit overlapping the inner flexible printed circuit such that the protrusion of the inner flexible printed circuit is spaced from the outer flexible printed circuit and forms an accommodating cavity with the outer flexible printed circuit; and
a fixing element comprising two first projecting lugs and two second projecting lugs; the two first projecting lugs protruding outwardly from the opposite sides of the inner flexible printed circuit adjacent to the protrusion; the two second projecting lugs protruding outwardly from the opposite sides of the outer flexible printed circuit adjacent to one end thereof and corresponding to the two first projecting lugs respectively to position the protrusion to prevent the protrusion from extruding along the longitudinal direction of the dual-layer flexible printed circuit.

11. The dual-layer flexible printed circuit as claimed in claim 10, wherein each first projecting lug defines a first fixing hole therethrough, each second projecting lug defines a second fixing hole therethrough corresponding to the first fixing hole, the two first projecting lugs are fixed to the two second projecting lugs with the two first fixing holes aim at and align with the two second fixing hole respectively.

12. The dual-layer flexible printed circuit as claimed in claim 10, wherein a portion of the cross section of the protrusion is substantially arcuate and formed by bending the inner flexible printed circuit adjacent to one distal end thereof toward the other opposite end of thereof.

13. The dual-layer flexible printed circuit as claimed in claim 10, wherein the inner flexible printed circuit is a band shaped flexible printed circuit and bent to be substantially U-shaped.

14. The dual-layer flexible printed circuit as claimed in claim 13, wherein the inner flexible printed circuit includes a laminating area disposed adjacent each distal end thereof; the protrusion is formed adjacent to one laminating area of the inner flexible printed circuit facing the other laminating area of the inner flexible printed circuit.

15. The dual-layer flexible printed circuit as claimed in claim 14, wherein the outer flexible printed circuit is substantially U-shaped and has substantially the same shape and size as the inner flexible printed circuit; the outer flexible printed circuit includes a laminating area disposed adjacent to each distal end thereof and fixed with the corresponding two laminating areas of the inner flexible printed circuit.

16. The dual-layer flexible printed circuit as claimed in claim 15, wherein the two laminating areas of the outer flexible printed circuit are fixed to the corresponding two laminating areas of the inner flexible printed circuit by surface mount technology.

* * * * *